(12) United States Patent
Doo et al.

(10) Patent No.: US 9,767,883 B2
(45) Date of Patent: Sep. 19, 2017

(54) SEMICONDUCTOR MEMORY DEVICE THAT PERFORMS A REFRESH OPERATION

(71) Applicant: SAMSUNG ELECTRONICS CO., LTD., Suwon-si, Gyeonggi-do (KR)

(72) Inventors: Suyeon Doo, Seoul (KR); Taeyoung Oh, Seoul (KR); Namjong Kim, Suwon-si (KR); Chulsung Park, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 14/827,686

(22) Filed: Aug. 17, 2015

(65) Prior Publication Data

US 2016/0125931 A1    May 5, 2016

(30) Foreign Application Priority Data

Nov. 3, 2014    (KR) .................. 10-2014-0151319

(51) Int. Cl.
*G11C 11/406* (2006.01)
(52) U.S. Cl.
CPC .............................. *G11C 11/40626* (2013.01)
(58) Field of Classification Search
CPC ............ G11C 11/40626; G11C 11/406; G11C 11/40615; G11C 11/40611; G11C 2211/4065
See application file for complete search history.

(56) References Cited

U.S. PATENT DOCUMENTS

| | | | | |
|---|---|---|---|---|
| 7,196,956 B2* | 3/2007 | Shirota | ................ | G11C 7/04 365/211 |
| 7,474,580 B2* | 1/2009 | Yang | ................ | G11C 7/04 365/191 |
| 7,843,752 B2* | 11/2010 | Noh | ................ | G11C 11/406 365/211 |
| 8,547,759 B2* | 10/2013 | Kadowaki | ............ | G11C 11/406 365/189.05 |
| 9,007,863 B1* | 4/2015 | Song | ................ | G11C 11/40615 365/212 |
| 9,190,138 B2* | 11/2015 | Song | ................ | G11C 11/40618 |
| 9,311,986 B2* | 4/2016 | Kim | ................ | G11C 11/40626 |
| 2010/0182851 A1 | 7/2010 | Lee et al. | | |
| 2013/0308405 A1 | 11/2013 | Jeong | | |
| 2014/0169114 A1 | 6/2014 | Oh | | |
| 2015/0036445 A1* | 2/2015 | Yoshida | ............ | G11C 11/40626 365/222 |

* cited by examiner

*Primary Examiner* — Hoai V Ho
*Assistant Examiner* — Roberto Mancera, Jr.
(74) *Attorney, Agent, or Firm* — F. Chau & Associates, LLC

(57) ABSTRACT

A semiconductor memory device includes a memory circuit including a plurality of memory cells and a refresh control circuit. The refresh control circuit is configured to determine a number of times to perform a target row refresh (TRR) in response to a mode register set (MRS) code signal, wherein the MRS code signal is generated in response to a temperature change, and the refresh control circuit is configured to maintain a refresh cycle of at least two of the memory cells for a period of time when the refresh cycle is changed due to the temperature change.

11 Claims, 9 Drawing Sheets

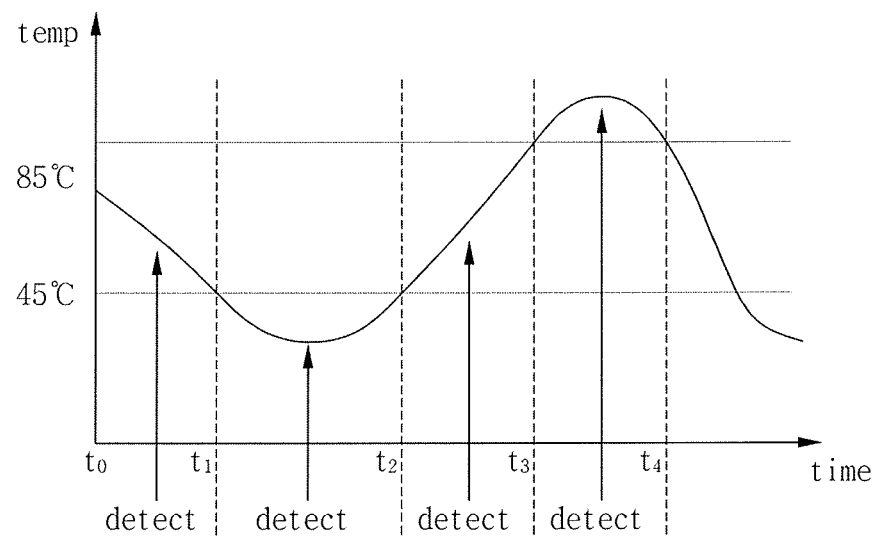

| MRS Code | REF MODE | OUTPUT SIGNAL | TRR REF MODE |
|---|---|---|---|
| 001$_B$ | 4×tREFI | REF_4X | TRR/32 |
| 010$_B$ | 2×tREFI | REF_2X | TRR/64 |
| 011$_B$ | 1×tREFI | REF_1X | TRR/128 |

SEMICONDUCTOR MEMORY DEVICE THAT PERFORMS A REFRESH OPERATION

CROSS-REFERENCE TO RELATED APPLICATION

This application claims priority under 35 U.S.C. §119 to Korean Patent Application No. 10-2014-0151319 filed on Nov. 3, 2014, the disclosure of which is incorporated by reference herein in its entirety.

BACKGROUND

Technical Field

Exemplary embodiments of the inventive concept relate to semiconductor memory devices, and more particularly, to a semiconductor memory device that performs a refresh operation.

Description of Related Art

Semiconductor devices are widely used in high-performance electronic systems and are being made with increased capacities and speeds.

A dynamic random access memory (DRAM) is an example of a semiconductor device. A DRAM stores each bit of data in a separate capacitor that constitutes a memory cell in combination with a transistor. A DRAM periodically performs a refresh operation to maintain data stored in its memory cells. A value of a refresh cycle may be preset for the DRAM, and thus, this value is unchanged regardless of process techniques.

Cell capacitors are being made smaller to meet demands of increased capacity and speed. However, this may cause various device characteristics to be degraded. For example, a short refresh time of a cell may be increased, a write characteristic of a cell may be reduced, or a variable retention time of a cell may be increased.

SUMMARY

Exemplary embodiments of the inventive concept provide a semiconductor memory device in which a target row refresh (TRR) is internally and stably performed when there is a change in temperature.

In accordance with an exemplary embodiment of the inventive concept, a semiconductor memory device includes a memory circuit including a plurality of memory cells and a refresh control circuit. The refresh control circuit is configured to determine a number of times to perform a TRR in response to a first mode register set (MRS) code signal, wherein the first MRS code signal is generated in response to a temperature change, and the refresh control circuit is configured to maintain a refresh cycle of at least two of the memory cells for a period of time when the refresh cycle is changed due to the temperature change.

In an exemplary embodiment of the inventive concept, the number of times to perform the TRR may be set to be smaller than a preset number at a room temperature when a normal refresh cycle is lengthened in response to the first MRS code signal.

In an exemplary embodiment of the inventive concept, the number of times to perform the TRR may be set to be greater than a preset number at a room temperature when a normal refresh cycle is shortened in response to the first MRS code signal.

In an exemplary embodiment of the inventive concept, determined number of the TRR may be completed in response to the first MRS code signal before performing the TRR in response to a second MRS code signal input after the first MRS code signal.

In an exemplary embodiment of the inventive concept, after the determined number of the TRR is completed in response to the first MRS code signal, the TRR may be performed in response to a second MRS code signal.

In accordance with an exemplary embodiment of the inventive concept, a semiconductor device may include a refresh control circuit configured to set a refresh cycle and a refresh mode according to a temperature change and generate a count enable signal, and a memory circuit configured to perform a normal refresh and a TRR in a temperature mode set before the temperature change and complete the normal refresh in response to the count enable signal.

In an exemplary embodiment of the inventive concept, the refresh control circuit may include a temperature sensor configured to sense the temperature change and generate an MRS code signal, a TRR count circuit configured to receive the MRS code signal and generate a cycle mode signal corresponding to the MRS code signal, and a refresh cycle signal generation circuit configured to generate the count enable signal in response to the cycle mode signal.

In an exemplary embodiment of the inventive concept, the temperature sensor may generate a first MRS code signal when a temperature lower than a room temperature is sensed, a second MRS code signal when the room temperature is sensed, and a third MRS code signal when a temperature higher than the room temperature is sensed.

In an exemplary embodiment of the inventive concept, the TRR count circuit may output a first cycle mode signal in response to the first MRS code signal, a second cycle mode signal in response to the second MRS code signal, and a third cycle mode signal in response to the third MRS code signal.

In an exemplary embodiment of the inventive concept, the first cycle mode signal may have a cycle longer than a cycle of the second cycle mode signal and the cycle of the second cycle mode signal may be longer than a cycle of the third cycle mode signal.

In an exemplary embodiment of the inventive concept, the refresh cycle signal generation circuit may include a count unit circuit configured to receive a clock signal and generate a plurality of counting clock signals, and a cycle change circuit configured to generate the count enable signal in response to the plurality of counting clock signals and the cycle mode signal.

In an exemplary embodiment of the inventive concept, the count unit circuit may include a plurality of dividers.

In an exemplary embodiment of the inventive concept, when a cycle mode of the cycle mode signal is sampled, the cycle change circuit may control a reset of the counting clock signals to perform the TRR in a corresponding cycle mode.

In an exemplary embodiment of the inventive concept, when a cycle mode of the cycle mode signal is sampled, the normal refresh and the TRR may be performed in response to the count enable signal.

In an exemplary embodiment of the inventive concept, the TRR may be performed by a count set to the corresponding cycle mode while the count enable signal is activated.

In accordance with an exemplary embodiment of the inventive concept, a semiconductor device may include a memory circuit including a plurality of memory cells and a refresh control circuit configured to change a refresh cycle of the memory circuit according to a temperature change that occurs while a normal refresh is being performed, wherein a refresh mode is changed responsive to the temperature change after a predetermined time measured from a time of the normal refresh set before the temperature change.

In an exemplary embodiment of the inventive concept, an MRS code signal is used to indicate the temperature change.

In an exemplary embodiment of the inventive concept, the MRS code signal determines a number of times to perform a TRR.

In an exemplary embodiment of the inventive concept, the normal refresh and the determined number of the TRR may be performed in a refresh mode set before the temperature change during a predetermined delay time.

In an exemplary embodiment of the inventive concept, the determined number of the TRR may be performed during the predetermined delay time.

BRIEF DESCRIPTION OF THE DRAWINGS

The foregoing and other features of the inventive concept will become more apparent by describing in detail exemplary embodiments thereof with reference to the accompanying drawings. In the drawings:

FIG. 3 is a graph showing a sensing operation of a temperature sensor in accordance with an exemplary embodiment of the inventive concept;

FIG. 4 is a table showing mode register set (MRS) codes in sensed temperature intervals in accordance with an exemplary embodiment of the inventive concept;

DETAILED DESCRIPTION OF THE EMBODIMENTS

Hereinafter, exemplary embodiments of the inventive concept will be described in detail with reference to the accompanying drawings.

The inventive concept may, however, be embodied in different forms and should not be construed as limited to the exemplary embodiments set forth in this specification.

It will be understood that when an element is referred to as being "connected" or "coupled" to another element, it can be directly connected or coupled to the other element or intervening elements may be present.

As used herein, the singular forms "a," "an," and "the" are intended to include the plural forms as well, unless the context clearly indicates otherwise.

It should also be noted that in some implementations, the functions or operations described in a particular block of a flowchart may occur in a different way or out of the order from a flow described in the flowchart. For example, two consecutive blocks may be performed simultaneously, or the blocks may be performed in reverse, depending on the functions or operations involved.

Figure 1:
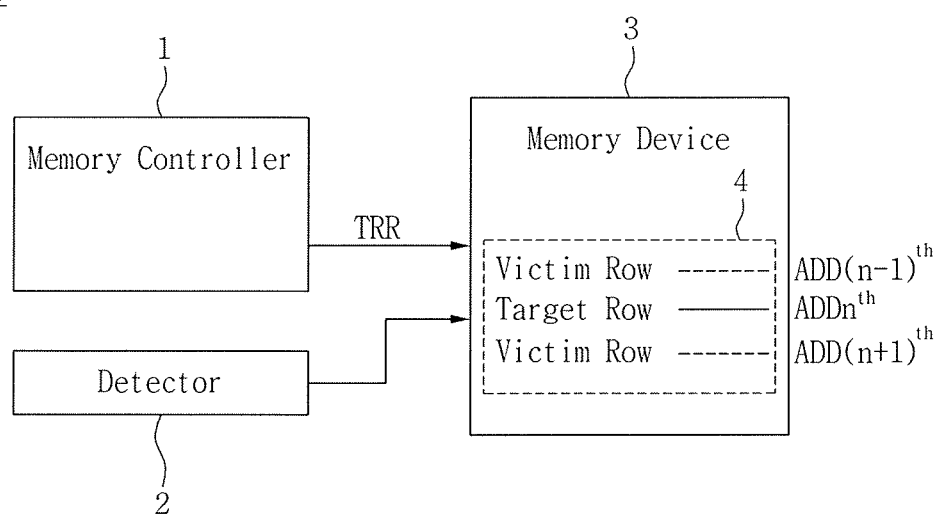
FIG. 1 is a block diagram of a general semiconductor memory device.

FIG. 1 is a block diagram of a general semiconductor memory device 10.

Referring to FIG. 1, the semiconductor memory device 10 includes a memory controller 1, a detector 2, and a memory device 3.

The memory device 3 includes a memory cell array 4.

The memory cell array 4 includes a plurality of dynamic random access memory (DRAM) cells provided at interconnections of rows and columns.

During an operation of the memory device 3, a specific row, e.g., $ADDn^{th}$ may be frequently accessed. In the case that the specific row $ADDn^{th}$ is frequently accessed, an unintended side effect referred to as row hammering, may occur. For example, when the specific row $ADDn^{th}$ is row hammered, rows $ADD(n-1)^{th}$ and $ADD(n+1)^{th}$ adjacent to the specific row $ADDn^{th}$ may be degraded due to the over-activated row. More specifically, since a current may leak from the specific row $ADDn^{th}$ into the adjacent rows $ADD(n-1)^{th}$ and $ADD(n+1)^{th}$, data of the adjacent rows $ADD(n-1)^{th}$ and $ADD(n+1)^{th}$ may not be properly maintained.

The detector 2 counts how many times the specific row is repeatedly accessed to detect whether the adjacent rows are affected by the repeated access on the specific row. The memory controller 1 sets a row having a specific address as a target row and sets rows adjacent to the target row as victim rows when the access count of the specific address is greater than a predetermined number. Therefore, a target row refresh (hereinafter, referred to as 'TRR') may be performed on the victim rows.

In other words, the memory controller 1 finds the target row and performs the TRR on the adjacent rows to safely maintain the data of the adjacent rows.

The TRR is performed with a predetermined cycle at a predetermined temperature when the row hammering occurs. However, since the memory device 3 is sensitive to temperature, a refresh cycle of the memory device 3 may be changed due to a change in temperature. Therefore, the TRR may be performed without consideration of temperature change.

Figure 2:
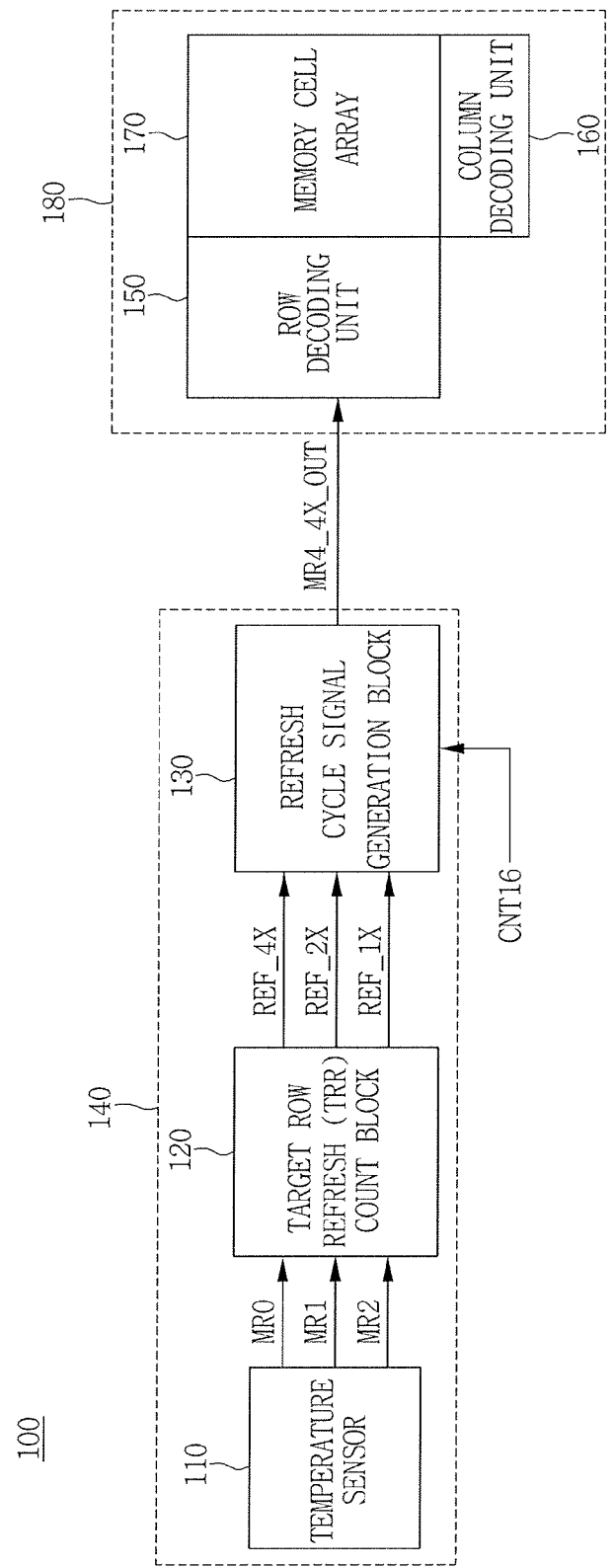
FIG. 2 is a block diagram of a semiconductor memory device in accordance with an exemplary embodiment of the inventive concept.

FIG. 2 is a block diagram of a semiconductor memory device 100 in accordance with an exemplary embodiment of the inventive concept.

Referring to FIG. 2, the semiconductor memory device 100 may include a refresh control block 140 and a memory block 180.

The refresh control block 140 may include a temperature sensor 110, a TRR to count block 120, and a refresh cycle signal generation block 130.

Further, the memory block 180 may include a row decoding unit 150, a column decoding unit 160, and a memory cell array 170.

The individual components of the refresh control block 140 and the memory block 180 may consist of circuits. For example, the TRR count block 120 may be a TRR count circuit and the refresh cycle signal generation block 130 may be a refresh cycle signal generation circuit.

The temperature sensor 110 may sense a temperature change of the semiconductor memory device 100 to provide mode register set (MRS) code signals MR0, MR1, and MR2 to the TRR count block 120.

A refresh mode of a DRAM includes an auto refresh mode and a self refresh mode. Generally, when a temperature of the DRAM is high, a cell capacitor may quickly lose its charge. Therefore, when the temperature of the DRAM is high, the refresh cycle may be decreased. Conversely, when the temperature of the DRAM is low, the refresh cycle may be increased so as not to be excessively refreshed.

The temperature sensor 110 may sense the temperature change of the semiconductor memory device 100 to control the refresh cycle of the memory block 180. The temperature sensor 110 may provide at a predetermined temperature, for example, a room temperature, a second code signal MR1, a third code signal MR2 when the temperature is higher than the room temperature (e.g., a hot temperature situation), or a first code signal MR0 when the temperature is lower than the room temperature (e.g., a low temperature situation). Operations of the temperature sensor 110 will be described in detail with reference to FIGS. 3 and 4.

The TRR count block 120 may receive the plurality of code signals MR0 to MR2 and then provide refresh mode signals REF_4X, REF_2X, and REF_1X respectively corresponding to the code signals MR0, MR1 and MR2.

In other words, the TRR count block 120 may select a refresh cycle mode according to a corresponding code signal.

When the TRR count block 120 receives the activated first code signal MR0, the TRR count block 120 outputs a first cycle mode signal REF_4X. When the TRR count block 120 receives the activated second code signal MR1, the TRR count block 120 outputs a second cycle mode signal REF_2X. When the TRR count block 120 receives the activated third code signal MR2, the TRR count block 120 outputs a third cycle mode signal REF_1X.

The TRR count block 120 may change a TRR refresh cycle according to a temperature change. The TRR count block 120 enables the TRR to be operated with a longer refresh cycle as the temperature is reduced, and enables the TRR to be operated with a shorter refresh cycle as the temperature is increased. Descriptions of the TRR count block 120 will be described below in detail.

The refresh cycle signal generation block 130 may provide a count enable signal MR4_4X_OUT in response to a clock signal CNT16 and the refresh mode signals REF_4X, REF_2X, and REF_1X.

The refresh cycle signal generation block 130 in accordance with an exemplary embodiment of the inventive concept may control a delay of a normal refresh according to a TRR mode.

For example, when the refresh cycle signal generation block 130 operates in a high temperature environment that has been changed from a low temperature environment, the temperature sensor 110 changes and provides the code signal corresponding to the high temperature environment. In the high temperature environment, internal operations of the memory block 180 may respond slower than in an external system. Therefore, the TRR may not be performed at an appropriate timing during a system turn-around time due to a difference between a system command and a response rate of the internal operation.

To perform the TRR at an appropriate timing, when the refresh is performed in a predetermined TRR mode at a low temperature, the refresh cycle signal generation block 130 waits until the TRR (of the low temperature mode) is completed before operating in response to a subsequent temperature change. Specifically, since a normal refresh cycle is longer at the low temperature, the wait time is set so that the TRR is performed in response to the normal refresh cycle. In other words, the wait time allows the refresh to be performed at the low temperature. For example, the TRR may be set to the number of command counts in consideration of low temperature operation.

When the temperature is suddenly changed to a high temperature, the refresh cycle is shortened. Thus, since the internal operation may be slow to respond to the instruction to operate with the slow refresh cycle signal, a mismatch may occur at a time in which the TRR is performed. In other words, when the TRR is performed in response to an increased number of command counts according to the changed mode while the refresh cycle signal has not yet been changed to operate with the slow refresh cycle, the refresh operation may not be correctly performed on the victim rows.

Accordingly, the refresh cycle signal generation block 130 controls the TRR mode, previously set by sampling a temperature environment (e.g., the lower temperature environment), to be fully completed even if the temperature changes are detected (e.g., the higher temperature environment). This will be described below.

The row decoding unit 150 may decode an internal address according to the count enable signal MR4_4X_OUT and perform a refresh operation on a corresponding word line in the memory cell array 170.

The column decoding unit 160 may select a corresponding column line of the memory cell array 170.

The memory cell array 170 may include a plurality of rows (e.g., wordlines) and a plurality of columns (e.g., bitlines), and a plurality of DRAM cells located at interconnections of the plurality of rows and the plurality of columns.

FIG. 3 is a graph showing a sensing operation of the temperature sensor 110 of FIG. 2 in accordance with an exemplary embodiment of the inventive concept and FIG. 4 is a table showing MRS codes in sensed temperature intervals in accordance with an exemplary embodiment of the inventive concept.

Operations of the temperature sensor 110 (see FIG. 2) will be described in detail with reference to FIGS. 3 and 4.

An X-axis of FIG. 3 denotes time and a Y-axis of FIG. 3 denotes temperature.

For example, when a temperature interval in a range of 45° C. to 85° C. is denoted as a room temperature, a temperature of 45° C. or less is denoted as a low temperature, and a temperature of 85° C. or more is denoted as a high temperature. Referring to FIG. 3, since the temperature is between 45° C. and 85° C. in a time interval $t_0$ to $t_1$, the temperature is detected as the room temperature. Since the temperature is 45° C. or less in a time interval $t_1$ to $t_2$, the temperature is detected as the low temperature. Since the temperature is between 45° C. and 85° C. in a time interval $t_2$ to $t_3$, the temperature is detected as the room temperature. Since the temperature is 85° C. or more in a time interval $t_3$ to $t_4$, the temperature is detected as the high temperature.

With reference to the table in FIG. 4, the temperature sensor 110 (see FIG. 2) provides the second code signal MR1 which is $010_B$ (where B represents binary), which is a MRS code signal indicating that the time interval $t_0$ to $t_1$ is the room temperature interval.

Further, with reference to the table in FIG. 4, since the time interval $t_1$ to $t_2$ is the low temperature interval, the temperature sensor 110 provides the first code signal MR0 which is $001_B$ to indicate the time interval $t_1$ to $t_2$ is the low temperature interval. Since the time interval $t_2$ to $t_3$ is the room temperature interval, the temperature sensor 110 provides the second code signal MR1 which is $010_B$. Since the time interval $t_3$ to $t_4$ is the high temperature interval, the temperature sensor 110 provides the third code signal MR2 which is $011_B$ to indicate the time interval $t_3$ to $t_4$ is the high temperature interval.

Figures 5, 6:
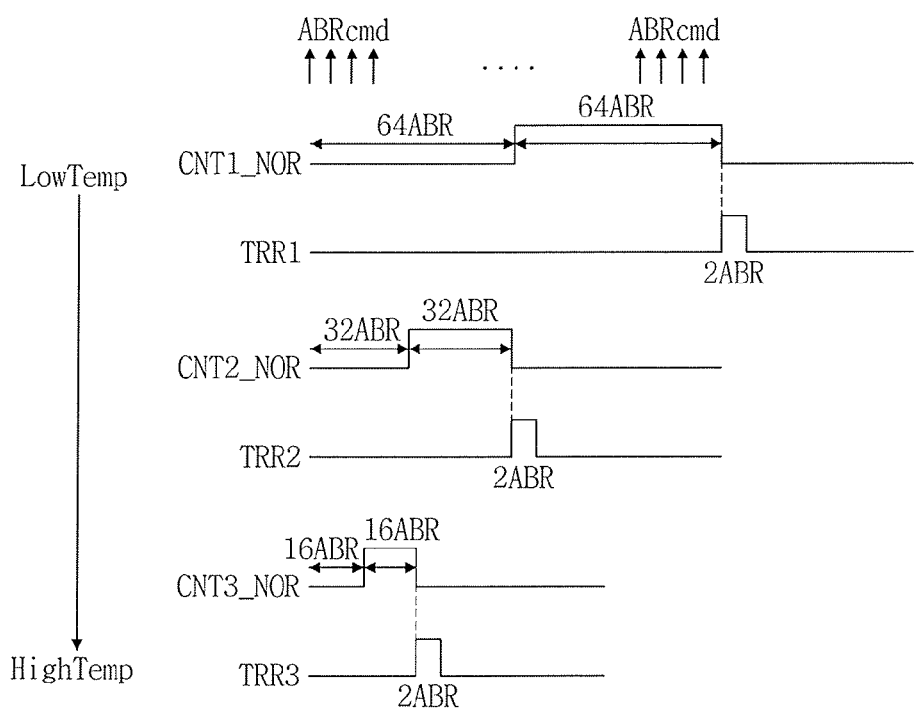
FIG. 5 is a table showing cycle mode selections according to MRS codes of a target row refresh (TRR) count block in accordance with an exemplary embodiment of the inventive concept.
FIG. 6 is a timing diagram showing a result of performing a TRR by the number of commands according to a temperature change and a cycle mode.

FIG. 5 is a table showing cycle mode selections according to the MRS codes of the TRR count block 120 (see FIG. 2) in accordance with an exemplary embodiment of the inventive concept.

Referring to FIG. 5, the TRR count block 120 outputs a first cycle mode signal REF_4X in response to $001_B$ which is the first code signal MR0 to select a 4XtREFI mode.

Generally, in a semiconductor memory device, when a refresh is performed on one row of 16 K bits during 64 ms, the time taken to refresh the row is shown in Equation 1.

$$tREFI = 64 \text{ ms}/16 \text{ K} = 3.9 \text{ uS},$$ [Equation 1]

where tREFI is one row execution time.

In the case of the low temperature, a refresh command is received every 4XtREFI to have a longer refresh cycle.

In this case, for example, the TRR mode in accordance with an exemplary embodiment of the inventive concept is set to perform after 32 refresh commands (e.g., TRR/32).

The TRR count block 120 (see FIG. 2) outputs a second cycle mode signal REF_2X in response to $010_E$ which is the second code signal MR1 to select a 2XtREFI mode.

In the case of the room temperature higher than the low temperature, the refresh cycle signal may be shorter than in the case of the low temperature.

Thus, the refresh command is generated every 2XtREFI and the TRR mode in this case is set to perform after 64 refresh commands (e.g., TRR/64).

The TRR count block 120 (see FIG. 2) outputs a third cycle mode signal REF_1X in response to $011_B$ which is the third code signal MR2 to select a 1XtREFI mode. In the case of the high temperature, since the refresh cycle is decreased, the refresh command is generated every 1XtREFI and the TRR mode in this case is set to perform after 128 refresh commands (e.g., TRR/128). As can be seen, the refresh cycle and the TRR may both change depending on a temperature change.

It is to be understood that the table shown in FIG. 5 is only an example, and thus, the number of the refresh commands at a time point in which the TRR is performed may be changed according to circuit design and a degree of integration.

In FIG. 6, the case of setting the number of the refresh commands without consideration of a temperature change is illustrated.

FIG. 6 is a timing diagram showing a result of performing a TRR due to the number of commands according to a temperature change and a cycle mode.

Referring to FIG. 6, the case in which the refresh cycle and the number of the refresh commands are set (ABRcmd) in each case of a low temperature, a room temperature, and a high temperature, is shown.

Referring to FIG. 6, it is assumed that a TRR is performed on two rows (e.g., sacrificial rows adjacent to a hammered row) at the room temperature (see CNT2_NOR) after 64 ABR commands.

In the case in which the temperature is changed, when the TRR is performed on the sacrificial rows at the low temperature (see CNT1_NOR) after 128 ABR commands, it shows that the TRR may be performed later at a predetermined physical location or later than a predetermined timing, which are originally intended.

In the case of the high temperature (see CNT3_NOR) after 32 ABR commands, it shows that the TRR may be performed faster on the sacrificial rows.

In accordance with an exemplary embodiment of the inventive concept, as described with reference to FIG. 5, the number of the commands is set so that the TRR is performed at a time substantially equal to the time which is set so that the TRR is performed on the sacrificial rows at the room temperature, in each temperature interval.

Figure 7:
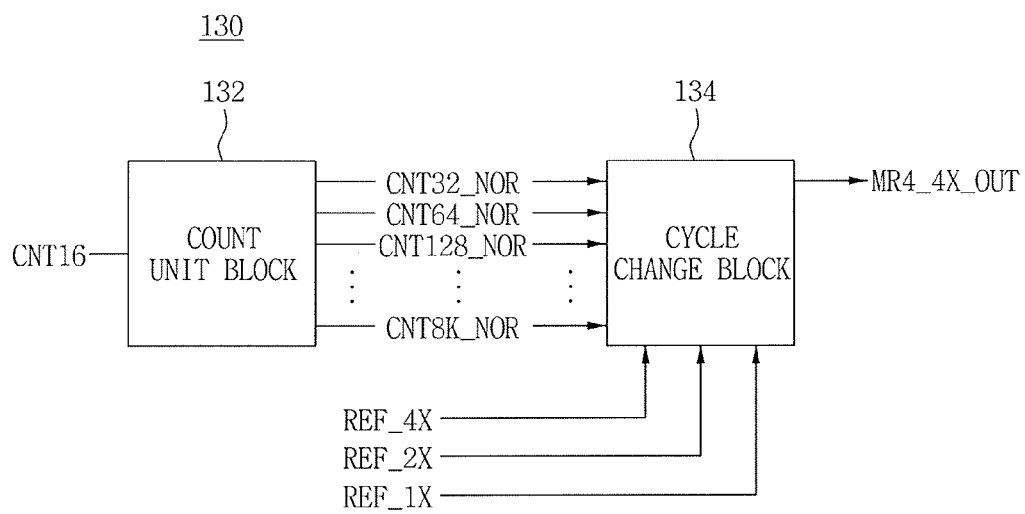
FIG. 7 is a block diagram of a refresh cycle signal generation block shown in FIG. 2 in accordance with an exemplary embodiment of the inventive concept.

FIG. 7 is a block diagram of the refresh cycle signal generation block 130 shown in FIG. 2 in accordance with an exemplary embodiment of the inventive concept.

Referring to FIG. 7, the refresh cycle signal generation block 130 includes a count unit block 132 and a cycle change block 134.

The count unit block 132 receives the clock signal CNT16 and generates various counting clock signals CNT32_NOR to CNT8K_NOR.

The count unit block 132 may generate clocks by dividing the clock signal CNT16 using a divider. This will be described in detail with reference to FIG. 8.

The cycle change block 134 generates the count enable signal MR4_4X_OUT in response to the various counting clock signals CNT32_NOR to CNT8K_NOR and first to third cycle mode signals REF_4X to REF_1X.

The cycle change block 134 may control a reset of the counting clock signals CNT32_NOR to CNT8K_NOR to perform the TRR in a corresponding mode when the corresponding mode is sampled in response to the first to third cycle mode signals REF_4X to REF_1X. Descriptions for the cycle change block 134 will be described with reference to FIG. 9.

Figure 8:
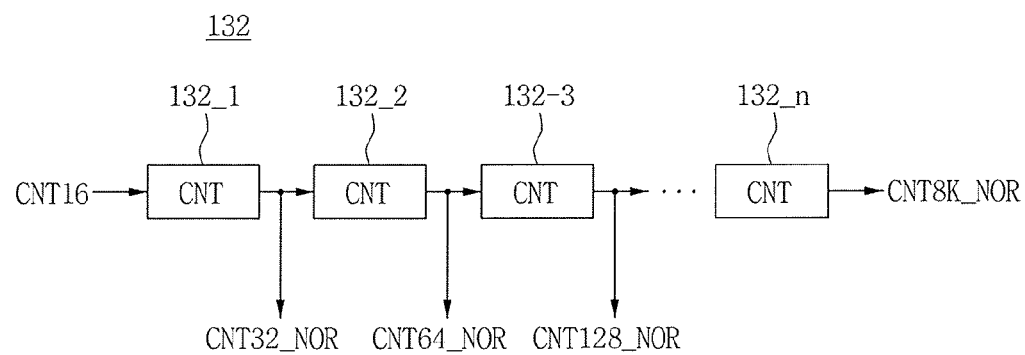
FIG. 8 is a block diagram of a count unit block shown in FIG. 7 in accordance with an exemplary embodiment of the inventive concept.

FIG. 8 is a block diagram of the count unit block 132 shown in FIG. 7 in accordance with an exemplary embodiment of the inventive concept.

The count unit block 132 includes a plurality of dividers CNT.

A first divider 132-1 divides the clock signal CNT16 into two and then generates a second clock cycle signal CNT32_NOR.

A second divider 132-2 divides the second clock cycle signal CNT32_NOR into two and then generates a third clock cycle signal CNT64_NOR.

A third divider 132-3 divides the third clock cycle signal CNT64_NOR into two and then generates a fourth clock cycle signal CNT128_NOR.

Then, an nth divider 132-*n* divides the preceding clock cycle signal into two and then generates a final clock cycle signal CNT8K_NOR.

Hereinabove, although the case in which the generated clock cycle signal CNT8K_NOR which controls the performance of the refresh until a desired time point using the basic divider is illustrated, it is not limited thereto. A final delayed clock cycle signal may be generated using delay devices having a predetermined delay.

Figure 9:
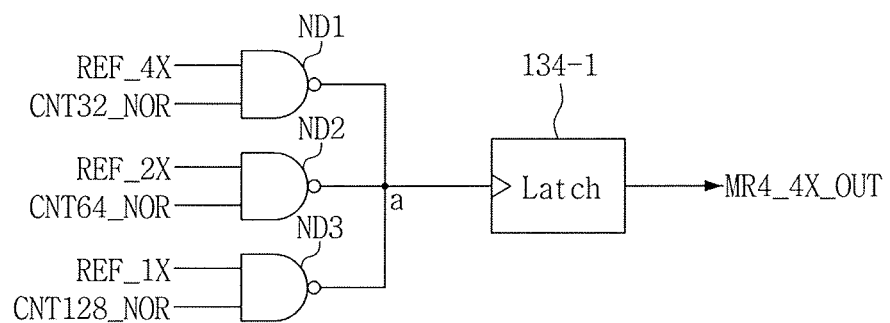
FIG. 9 is a circuit diagram of a cycle change block shown in FIG. 7 in accordance with an exemplary embodiment of the inventive concept.

FIG. 9 is a circuit diagram of the cycle change block 134 shown in FIG. 7 in accordance with an exemplary embodiment of the inventive concept.

Referring to FIG. 9, the cycle change block 134 may include a plurality of NAND gates ND1 to ND3 and a latch device 134-1.

A first NAND gate ND1 performs a NAND operation on the first cycle mode signal REF_4X and the second clock cycle signal CNT32_NOR.

A second NAND gate ND2 performs a NAND operation on the second cycle mode signal REF_2X and the third clock cycle signal CNT64_NOR.

A third NAND gate ND3 performs a NAND operation on the third cycle mode signal REF_1X and the fourth clock cycle signal CNT128_NOR.

Outputs of the plurality of NAND gates ND1 to ND3 are electrically connected to a node a.

The latch device 134-1 inverts and latches an output of the node a to generate the count enable signal MR4_4X_OUT.

An operation of the cycle change block 134 will be described below.

For example, when a low temperature is sensed, the cycle change block 134 outputs a low level to the node a in response to an activated first cycle mode signal REF_4X, of the plurality of cycle mode signals, and the second clock cycle signal CNT32_NOR.

The latch device 134-1 inverts and latches the level of the node a.

In an operation of the cycle change block 134, for example, when the first cycle mode signal REF_4X is activated and the second clock cycle signal CNT32_NOR is input, the first NAND gate ND1 outputs the low level.

Since the latch device 134-1 latches the inverted level of the node a, a high level is maintained.

Thus, the count enable signal MR4_4X_OUT which is activated in response to activation of the first mode signal REF_4X is output.

The latch device 134-1 may continue to output a signal so that a high level of the count enable signal MR4_4X_OUT is maintained until a final set counting operation is completed based on the clock signal CNT16.

By keeping the count enable signal MR4_4X_OUT high, the refresh in the previously sampled temperature environment may continue to be performed, even though a cycle of the counting clock is shortened due to a change of the refresh cycle prompted by the change in temperature change to low.

In other words, according to an exemplary embodiment of the inventive concept, when the refresh cycle is changed in response to a change in the temperature, the refresh mode is changed at a predetermined delay time. The refresh associated with the changed refresh mode is not performed until after the predetermined time which is measured from the end of the prior refresh. The prior refresh being the refresh before the temperature change. Thus, after being delayed by the activated time of the count enable signal MR4_4X_OUT, which allows the internal operation to be prepared, the normal refresh and the TRR may be performed with the changed refresh cycle.

Figure 10:
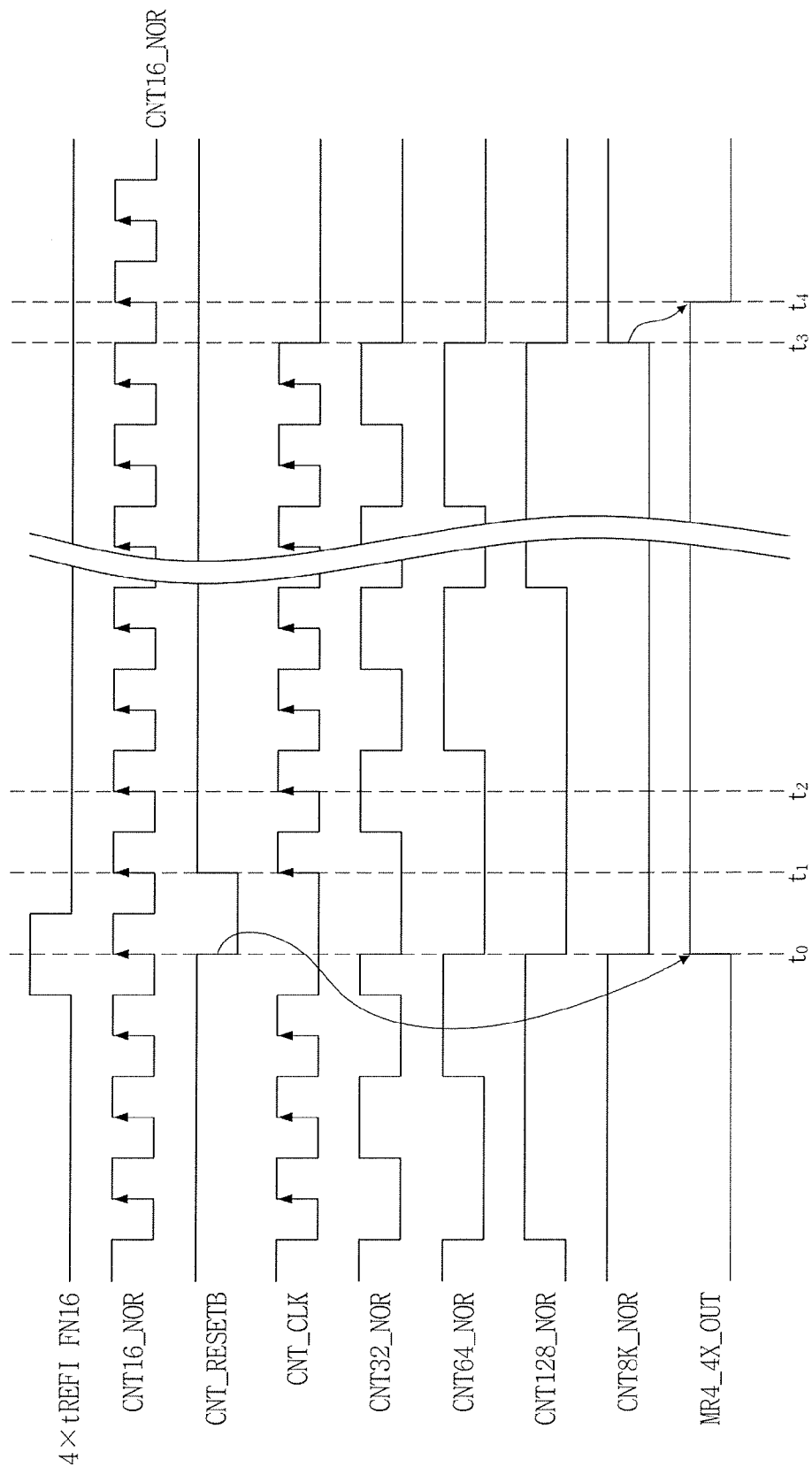
FIG. 10 is a timing diagram showing an operation of the semiconductor memory device shown in FIG. 2 in accordance with an exemplary embodiment of the inventive concept.

FIG. 10 is a timing diagram showing an operation of the semiconductor memory device 100 shown in FIG. 2 in accordance with an exemplary embodiment of the inventive concept.

Referring to FIG. 10, in a time interval $t_0$-$t_1$, while a main clock signal CNT16_NOR is clocked, when a 4XtREFI mode is activated, a reset signal CNT_RESETB is activated.

Thus, a count of each divided clock may be reset in response to the reset signal CNT_RESETB.

Referring to the time interval t0 to t1, all counting operations of a count clock CNT_CLK, the second clock cycle signal CNT32_NOR, the third clock cycle signal CNT64_NOR, the fourth clock cycle signal CNT128_NOR, and the final clock signal CNT8K_NOR, which are generated to count 16 ABR commands in a cycle, are reset.

In the time interval t0 to t1, a count enable signal MR4_4X_OUT is activated in response to the reset signal CNT_RESETB. The count enable signal MR4_4X_OUT may be deactivated at time point t4 when the final clock signal CNT8K_NOR is activated.

In the time interval $t_1$ to $t_2$, the count clock CNT_CLK starts to count, and the second clock cycle signal CNT32_NOR starts to count in response to the counting of the count clock CNT_CLK. However, the refresh is controlled to continue to perform in response to the count enable signal MR4_4X_OUT.

Thus, even though a command to change the refresh mode is received, the refresh command already being performed is stably counted in response to the count enable signal MR4_4X_OUT in a predetermined temperature environment. In addition, the TRR operation may be performed in response to the cycle mode during an activation interval of the count enable signal MR4_4X_OUT. For example, as shown in FIG. 5, the TRR may be performed every 32 ABR commands.

Here, although it is illustrated that a low temperature mode is sampled using a rising edge of the main clock signal CNT16_NOR which is a clock having the same clock cycle as the count clock CNT_CLK, a falling edge may be used.

As described above, the semiconductor memory device according to an exemplary embodiment of the inventive concept enables a refresh that is performing in the low temperature mode to be stably completed even though a temperature change occurs causing a high temperature mode to be entered and thus a change of the refresh cycle. As described above, a predetermined delay time is set to prepare the internal operation of the semiconductor memory device even though there is a change in the temperature mode in the system in which it operates. Thus, a difference in the response rate between the system and the semiconductor memory device may be reduced or eliminated, thereby preventing a refresh malfunction and allowing data to be properly maintained.

Figure 11:
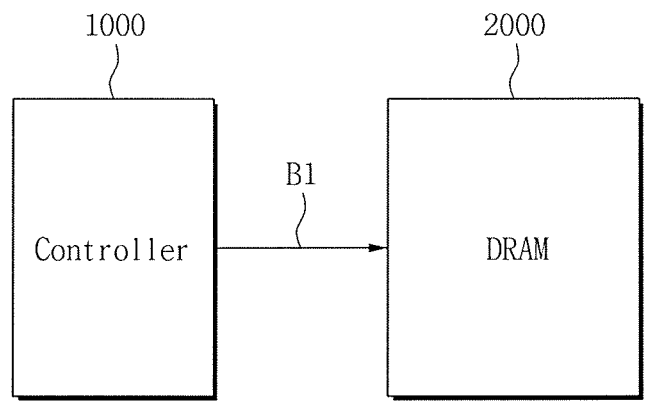
FIG. 11 is a block diagram of a memory system to which a semiconductor memory device in accordance with an exemplary embodiment of the inventive concept is applied.

FIG. 11 is a block diagram of a memory system to which a semiconductor memory device in accordance with an exemplary embodiment of the inventive concept is applied.

Referring to FIG. 11, the memory system may include a controller 1000 and a semiconductor memory device (e.g., DRAM) 2000 in accordance with an exemplary embodiment of the inventive concept. The controller 1000 is connected to the DRAM through a bus B1. The controller 1000 may be connected to a host through a predetermined interface.

The semiconductor memory device 2000 may have the same circuit configuration as shown in FIG. 2.

Therefore, in the memory system, the semiconductor memory device 2000 supports a count operation to be stably performed in a set temperature mode even though a temperature change occurs from a low temperature mode to a high temperature mode.

Figure 12:
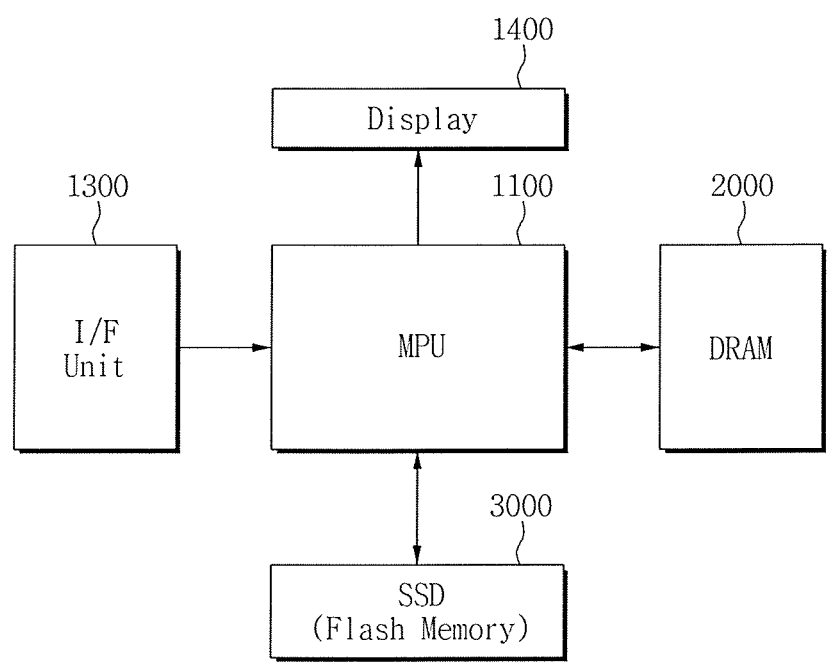
FIG. 12 is a block diagram of a mobile device to which a semiconductor memory device in accordance with an exemplary embodiment of the inventive concept is applied.

FIG. 12 is a block diagram of a mobile device to which the semiconductor memory device in accordance with an exemplary embodiment of the inventive concept is applied.

Referring to FIG. 12, the mobile device, for example, a notebook or a portable electronic device may include a micro processing unit (MPU) 1100, a display 1400, an interface unit 1300, a semiconductor memory device 2000 (e.g., DRAM), and a solid state drive (SSD) 3000 (e.g., Flash memory).

The MPU 1100, the semiconductor memory device 2000, and the SSD 3000 may be manufactured or packaged as a single chip. Therefore, the semiconductor memory device 2000 and the SSD 3000 may be embedded in the mobile device.

When the mobile device is the portable electronic device, a modem and a transceiver, which perform transmission and reception of communication data and modulation and demodulation of data, may be connected to the interface unit 1300.

The MPU 1100 controls overall operations of the mobile device according to a preset program.

The semiconductor memory device 2000 may be connected to the MPU 1100 through a system bus and may serve as a buffer memory or a main memory of the MPU 1100. The semiconductor memory device 2000 supports a count operation to be stably performed in a set temperature mode even though a temperature change occurs from a low temperature mode to a high temperature mode.

The SSD 3000 may be implemented as a NOR type flash memory or a NAND type flash memory.

The display 1400 may include a touch screen such as a liquid crystal device having a backlight, a liquid crystal device having a light emitting diode (LED) light source, an organic LED (OLED), etc. The display 1400 serves as an output device which displays an image such as texts, numbers, pictures, or the like in color.

Although the mobile device has been mainly described for the mobile communication device, the mobile device may serve as a smart card by adding or removing components if necessary.

The mobile device may be connected to an external communication device through an additional interface. For example, the communication device, may include a digital versatile disc (DVD) player, a computer, a set top box (STB), a game console, a digital camcorder, etc.

An application chipset, a camera image processor (CIS), a mobile DRAM, or the like may be further included in the mobile device.

Although it is illustrated that a flash memory is used in the SSD 3000 in FIG. 12, various types of non-volatile storages may be used.

The non-volatile storage may store various data types such as texts, graphics, software codes, etc.

For example, the non-volatile storage may be implemented as an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM) which may be referred to as an ovonic unified memory (OUM), a resistive RAM (RRAM or ReRAM), a nanotube RRAM, a polymer RAM (PoRAM), a nano floating gate memory (NFGM), a holographic memory, a molecular electronics memory device, or an insulator resistance change memory.

Figure 13:
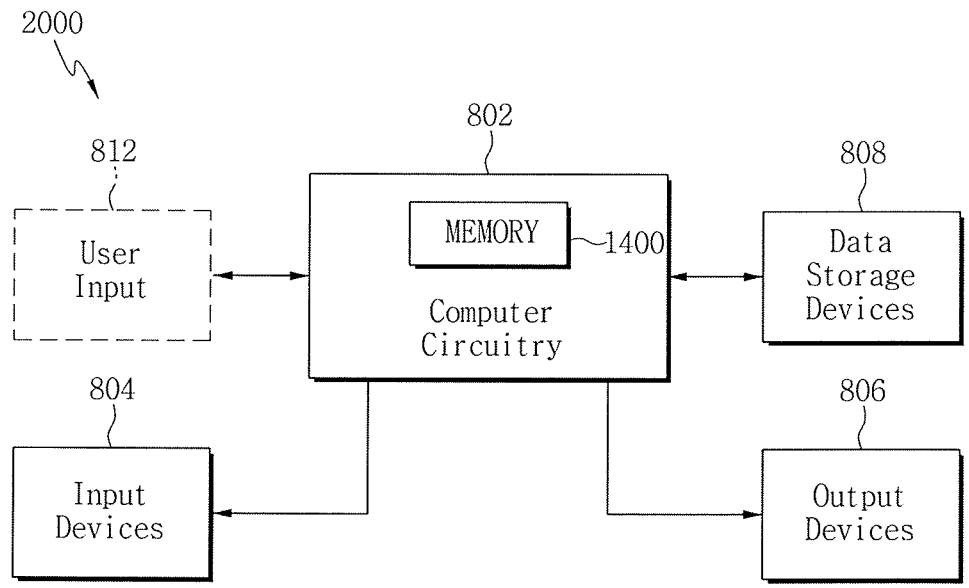
FIG. 13 is a block diagram of a data processing device to which a semiconductor memory device in accordance with an exemplary embodiment of the inventive concept is applied.

FIG. 13 is a block diagram of a data processing device 2000 to which a semiconductor memory device in accordance with an exemplary embodiment of the inventive concept is applied.

Referring to FIG. 13, the data processing device 2000 may include computer circuitry 802 including a memory 1400, input devices 804, output devices 806, and data storage devices 808. Further, a user input unit 812 may be included in the data processing device 2000. The user input unit 812 may be an input device including number keys, function keys, or the like, and may serve as an interface between an electronic system and a user.

The memory 1400 of the data processing device 2000 may include the semiconductor memory device 100 of FIG. 2.

Figure 14:
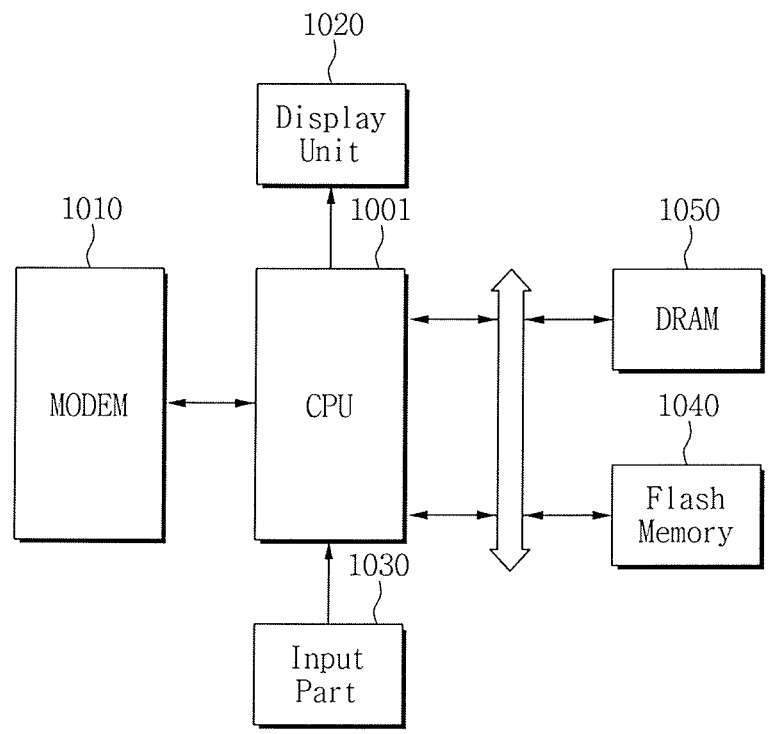
FIG. 14 is a block diagram of a mobile device to which a semiconductor memory device in accordance with an exemplary embodiment of the inventive concept is applied.

FIG. 14 is a block diagram of a mobile device to which a semiconductor memory device in accordance with an exemplary embodiment of the inventive concept is applied.

Referring to FIG. 14, the mobile device includes a modem 1010, a central processing unit (CPU) 1001, a semiconductor memory device 1050, a flash memory 1040, a display unit 1020, and an input part 1030.

The semiconductor memory device 1050 may be the semiconductor memory device 100 of FIG. 2.

The modem 1010 performs modulation and demodulation of communication data.

The CPU 1001 may control overall operations of the mobile device according to a preset program.

The semiconductor memory device 1050 may operate as a main memory of the CPU 1001 and include a DRAM cell.

The flash memory 1040 may include a NOR type flash memory or a NAND type flash memory.

The display unit 1020 may include a touch screen such as a liquid crystal device having a backlight, a liquid crystal device having an LED light source, an OLED, etc. The display unit 1020 may include an output device which displays an image such as texts, numbers, pictures, or the like in color.

The input part 1030 may be an input device including number keys, function keys, or the like, and may serve to interface between an electronic system and a person.

The mobile device may serve as a mobile communication device, or a smart card or an SSD by adding or removing components if necessary.

A semiconductor memory device in accordance with an exemplary embodiment of the invention concept controls a TRR to be stably performed when a temperature change is detected prompting a change request for a refresh cycle, and thus a refresh characteristic and data safety can be improved.

While the inventive concept has been described with reference to exemplary embodiments thereof, it will be understood by those skilled in the art that various changes in form and detail may be made thereto without departing from the scope of the inventive concept as defined by the appended claims.

What is claimed is:

1. A semiconductor memory device, comprising:
    a refresh control circuit configured to set a refresh cycle and a refresh mode according to a temperature change and generate a count enable signal; and
    a memory circuit configured to perform a normal refresh and a target row refresh (TRR) in a temperature mode set before the temperature change and complete the normal refresh in response to the count enable signal, wherein the count enable signal is maintained until a final counting clock signal of a plurality of counting clock signals is activated, and when the final counting clock signal is activated, the count enable signal is deactivated, and wherein each of the plurality of counting clock signals is kept high for a different number of refresh commands than each other.

2. The device of claim 1, wherein the refresh control circuit comprises:
   a temperature sensor configured to sense the temperature change and generate a mode register set (MRS) code signal;
   a TRR count circuit configured to receive the MRS code signal and generate a cycle mode signal corresponding to the MRS code signal; and
   a refresh cycle signal generation circuit configured to generate the count enable signal in response to the cycle mode signal.

3. The device of claim 2, wherein the temperature sensor generates a first MRS code signal when a temperature lower than a room temperature is sensed, a second MRS code signal when the room temperature is sensed, and a third MRS code signal when a temperature higher than the room temperature is sensed.

4. The device of claim 3, wherein the TRR count circuit outputs a first cycle mode signal in response to the first MRS code signal, a second cycle mode signal in response to the second MRS code signal, and a third cycle mode signal in response to the third MRS code signal.

5. The device of claim 4, wherein the first cycle mode signal has a cycle longer than a cycle of the second cycle mode signal and the cycle of the second cycle mode signal is longer than a cycle of the third cycle mode signal.

6. The device of claim 2, wherein the refresh cycle signal generation circuit comprises:
   a count unit circuit configured to receive a clock signal and generate the plurality of counting clock signals; and
   a cycle change circuit configured to generate the count enable signal in response to the plurality of counting clock signals and the cycle mode signal.

7. The device of claim 6, wherein the count unit circuit comprises a plurality of dividers.

8. The device of claim 6, wherein, when a cycle mode of the cycle mode signal is sampled, the cycle change circuit controls a reset of the counting clock signals to perform the TRR in a corresponding cycle mode.

9. The device of claim 8, wherein, when a cycle mode of the cycle mode signal is sampled, the normal refresh and the TRR are performed in response to the count enable signal.

10. The device of claim 9, wherein the TRR is performed by a count set to the corresponding cycle mode while the count enable signal is activated.

11. A semiconductor memory device, comprising:
   a refresh control circuit configured to set a refresh cycle and a refresh mode according to a temperature change and generate a count enable signal; and
   a memory circuit configured to perform a normal refresh and a target row refresh (TRR) in a temperature mode set before the temperature change and complete the normal refresh in response to the count enable signal,
   wherein the count enable signal is maintained until a final counting clock signal of a plurality of counting clock signals is activated even while a command to change the refresh mode is received.

* * * * *